United States Patent
Paxton et al.

(10) Patent No.: US 6,872,014 B1
(45) Date of Patent: Mar. 29, 2005

(54) METHOD FOR DEVELOPING A PHOTORESIST PATTERN

(75) Inventors: Theodore A. Paxton, Chandler, AZ (US); Todd Davis, Gilbert, AZ (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/717,612

(22) Filed: Nov. 21, 2003

(51) Int. Cl.$^7$ .............................................. G03D 5/00
(52) U.S. Cl. .................. 396/567; 396/604; 396/611; 396/626; 118/52; 430/30
(58) Field of Search .............................. 396/567, 604, 396/611, 626; 118/52–56, 319–321; 427/240; 134/3, 4, 149; 430/30

(56) References Cited

U.S. PATENT DOCUMENTS

| | | |
|---|---|---|
| 5,331,364 A | 7/1994 | Borden |
| 5,476,320 A | 12/1995 | Taguchi et al. |
| 6,245,485 B1 | 6/2001 | Aoai et al. |
| 6,448,097 B1 * | 9/2002 | Singh et al. ............... 438/16 |
| 6,451,510 B1 | 9/2002 | Messick et al. |
| 6,472,130 B1 | 10/2002 | Geyer et al. |
| 6,572,285 B2 | 6/2003 | Yabe |
| 6,602,351 B2 | 8/2003 | DeYoung et al. |
| 2001/0009452 A1 * | 7/2001 | Matsuyama et al. ........ 396/611 |

FOREIGN PATENT DOCUMENTS

| | | |
|---|---|---|
| EP | 0 605 095 A1 | 11/1993 |
| WO | WO 99/53381 | 4/1999 |

* cited by examiner

*Primary Examiner*—D. Rutledge
(74) *Attorney, Agent, or Firm*—Pillsbury Winthrop LLP

(57) ABSTRACT

The present invention relates to a method for developing a photoresist pattern. The method consists of mixing a concentrated chemical solution with a solvent to obtain a diluted chemical solution of a predetermined concentration. In this method, the mixing is done in a fabrication facility where the substrates are processed. The diluted chemical solution is then applied onto the photoresist pattern. Analysis of the pattern is then carried out to detect any defects or pattern collapse on the substrate. In the event that defects and/or pattern collapse occur, the predetermined concentration is adjusted to reduce the phenomenon.

21 Claims, 6 Drawing Sheets

METHOD FOR DEVELOPING A PHOTORESIST PATTERN

BACKGROUND OF THE INVENTION

1. Field of the Invention

This invention relates to a method for developing a photoresist pattern, and more particularly to a method for developing a photoresist pattern wherein post-development defects are reduced.

2. Description of Related Art

Photolithography is an essential driver of the microelectronics industry. The ability to continually shrink designs to the point where sub-wavelength feature resolution is now routine, has allowed the industry to continue the trend toward higher device densities. To maintain this rate of development and to accomplish high device packing density, it has become necessary to incorporate sophisticated photolithographic processes.

Photolithography is the production of a three-dimensional image based on the patterned exposure to light and subsequent development of a light-sensitive photoresist on the wafer surface. Broadly stated, a radiation-sensitive photoresist is applied to a substrate such as a wafer and then an image exposure is transmitted to the photoresist, usually through a mask. Depending on the type of photoresist used, exposure will either increase or decrease the solubility of the exposed areas with a suitable solvent called a developer. A positive photoresist material will become more soluble in exposed regions whereas a negative photoresist will become less soluble in exposed regions. After exposure, regions of the substrate are dissolved by the developer and are no longer covered by the patterned photoresist film.

Unfortunately, as the demands of the microelectronics industry require smaller feature sizes, the line width defined by the resist is likewise becoming smaller. Yet, as the etch selectivity of resist to polysilicon or silicon nitride remains constant (or even decreases), the thickness of the resist also remains constant. This results in a higher aspect ratio of height to width of resist lines. With increasing aspect ratio, the mechanical stability of the resist lines decreases and post-development defects like resist collapses are likely to appear on the substrate.

Pattern collapses may have a dramatic impact on IC device yield. Hence, elimination of these defects becomes increasingly important in both research and development and manufacturing environments. Any delay in addressing the causes and cures of these yield killers can prolong the development cycle and production release of new product technologies. It is therefore crucial to develop new photolithographic processes that reduce the presence of post-development defects at critical mask layers.

SUMMARY OF THE INVENTION

The above objective is achieved in accordance with the present invention by providing a novel method for developing a photoresist pattern on a substrate wherein post-development defects are reduced.

In an embodiment of the invention, the method consists of mixing a concentrated chemical solution with a solvent to obtain a diluted chemical solution of a predetermined concentration. In this method, the mixing is done in a fabrication facility where the substrates are processed. The diluted chemical solution is then applied onto the photoresist pattern. Analysis of the pattern is then carried out to detect any defects such as pattern collapse on the substrate. In the event that defects occur, the predetermined concentration is adjusted to reduce the phenomenon.

In another embodiment of the invention, the method includes: mixing, in a fabrication facility where the substrate is processed, a concentrated chemical solution with a solvent to obtain a post develop rinse solution of a predetermined concentration; developing a latent image on the substrate to form a developed photoresist pattern; applying the post develop rinse solution onto the developed photoresist pattern; analyzing the developed photoresist pattern after the applying; and adjusting the predetermined concentration based on analysis of the developed photoresist pattern.

Additional objects and features of the invention will be apparent from the following detailed description, taken together with the accompanying drawings.

DETAILED DESCRIPTION

In the following description, in order to facilitate a thorough understanding of the invention and for purposes of explanation and not limitation, specific details are set forth, such as the process steps to reduce post-development defects or a particular geometry of the mixing nozzle. However, it should be understood that the invention may be practiced in other embodiments that depart from these specific details.

In the present document, the term "photoresist pattern" is used to encompass a latent image formed on the photoresist layer, after exposure, and a developed photoresist pattern.

Figure 1:
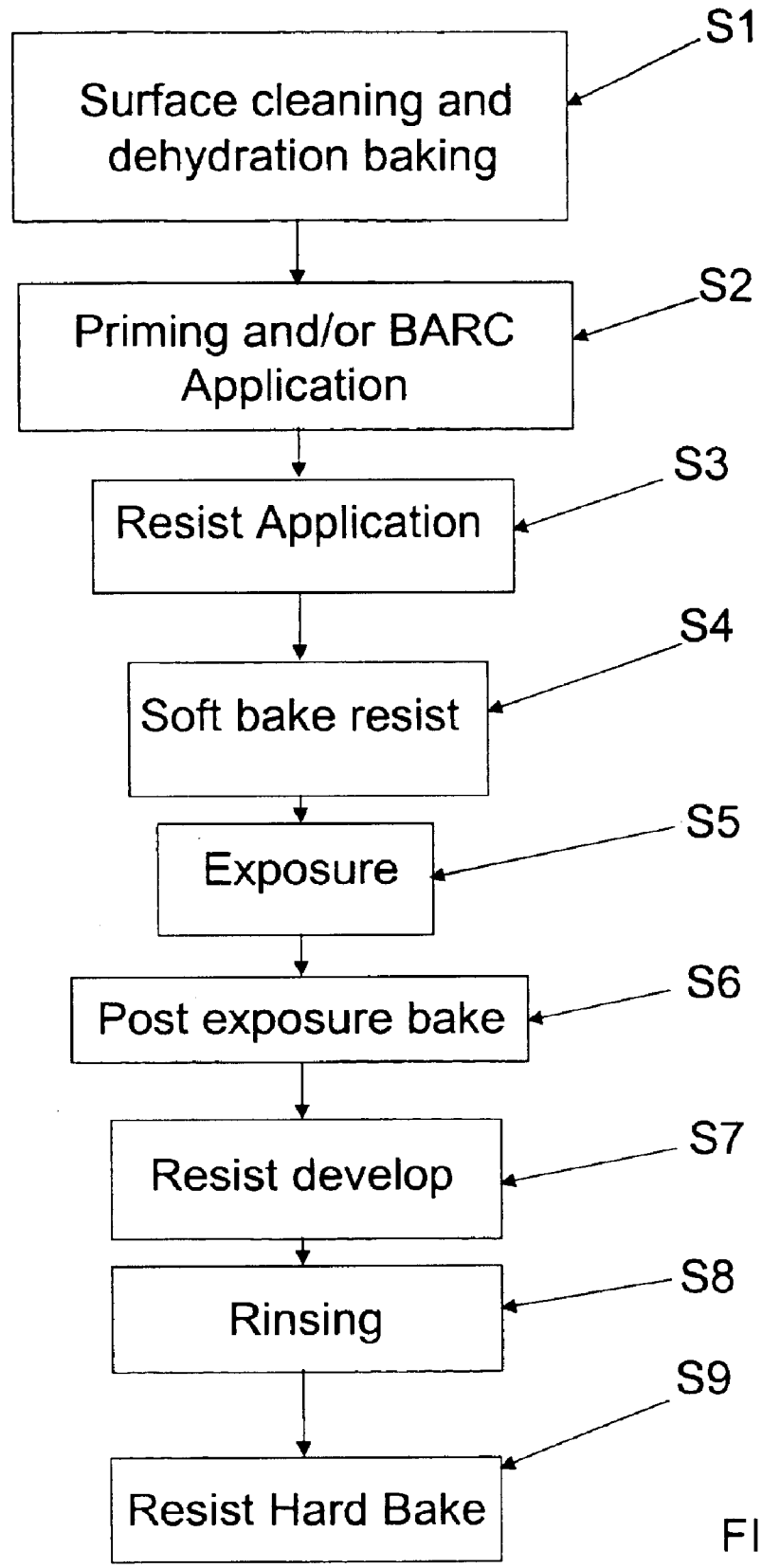
FIG. 1 is a schematic representation of the basic steps used in the photoresist process for the fabrication of an IC device according to one embodiment of the invention.

Basic steps that may be used in the photoresist process for the fabrication of an IC device according to one embodiment of the invention are illustrated in FIG. 1.

The method begins at (S1) where a surface cleaning and a dehydration baking are carried out to prepare the surface for photoresist application, though as one of ordinary skill in the art will appreciate, this step is not always necessary. The dehydration baking is performed to prevent moisture from interfering with the adhesion of the resist to the wafer surface. It is generally achieved by heating the substrates to drive off any surface moisture.

The method then proceeds to (S2) where a surface priming is applied to the wafers. This step is performed to ensure good adhesion of the resist to the substrate. Hence, the resist must be capable of adhering to the surface through all the resist processing and etch steps that are applied subsequently. Poor adhesion brings about severe undercutting, loss of resolution, or possibly complete loss of the pattern. Various techniques are used to increase the adhesion between the resist and a substrate, such as a) use of hexamethyldisilazane (HMDS) and vapor priming systems to promote resist adhesion for polysilicon, metals and $SiO_2$ layers, and b) elevated temperature post-bake cycles. HMDS functions as an effective adhesion promoter for silicon and silicon oxide containing films. An alternate method for promoting adhesion, which also alters lithographic performance, is the application of bottom anti-reflective coatings (BARC). BARC processes are typically applied using a spin coat method followed by a bake in a similar manner to the application of photo resist described below (steps S3 & S4).

The substrate is then spin coated (S3) with a photoresist to establish a thin, uniform, defect-free film of resist. The spin coating procedure typically has three stages wherein the photoresist is dispensed on the substrate surface. The substrate is accelerated to a final rotational speed and then spun at a constant speed to spread and dry the resist film. After the spinning stage, the coating layer may vary from 0.1 μm to 1.5 μm and may have a uniformity of plus or minus 0.005 μm.

The method then proceeds to (S4) where a soft bake step is carried out. The soft bake ensures that most of the solvent contained in the resist is driven off. The solvent content is typically reduced from around 20%–30% to around 5%. The soft bake may be carried out at a temperature of around 70° C. to 140° C. and can be done using a conventional oven or by using infra red or microwave techniques. Alternatively, the soft bake can be performed with a hot plate disposed in wafer track system. The processing times in that case are very short compared to the other methods (oven and microwave) and vary typically from 30 seconds to 90 seconds.

The photoresist is then selectively exposed with a mask to form the desired pattern in the resist (S5). The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithography processes include visible light, ultraviolet (UV) light, and deep ultraviolet (DUV) light or electron beam radiant energy.

After selective exposure, the substrates are then baked (Post Exposure Bake) to reduce the effects of standing waves in the resist and/or chemically stabilize the exposed resist (S6). The bake method could be any one of the ones described earlier. The time/temperature specifications for the Post Exposure Bake are a function of the baking method, exposure conditions, and resist chemistry, as generally understood by one of ordinary skill in the art.

The method then proceeds to (S7) where the photoresist is developed by chemical dissolution of the unpolymerized resist regions. This step is designed to leave in the resist layer an exact copy of the pattern that was on the mask. Next, the developer is removed (S8) from the substrate surface with a rinse solution to stop the development process. The rinse step is then followed by a spin drying. Frequently, a Resist Hard Bake is subsequently performed to remove residual solvents, improve adhesion and increase the etch resistance of the resist (S9).

Figure 2:
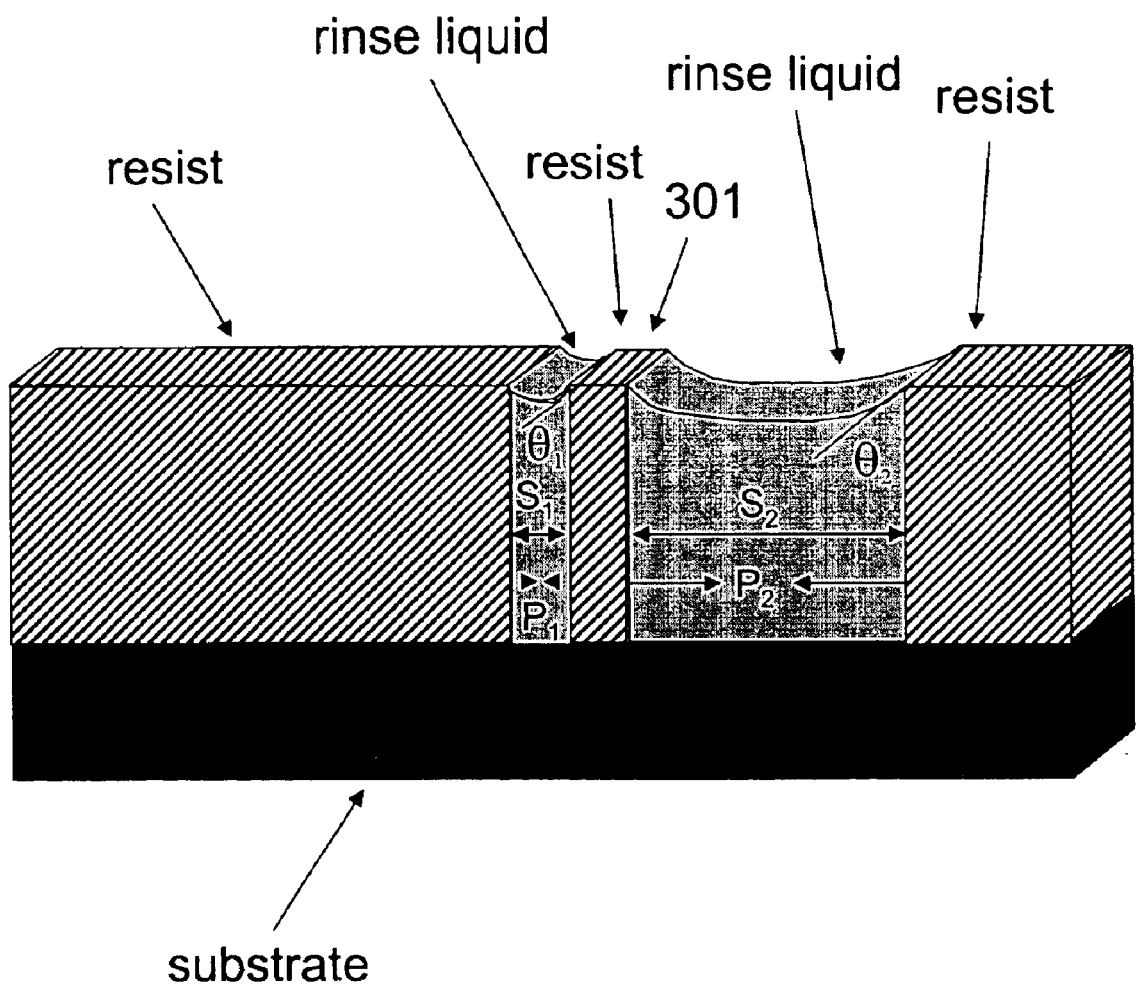
FIG. 2 is a schematic representation of a photoresist pattern that is subjected to an unbalanced capillary force.

Capillary forces, present in the aqueous drying after development of imaged resist pattern (S8), can result in resist deformation and pattern collapse. As a general matter, the presence of unbalanced capillary forces lead to a net force on the pattern. This principle is illustrated in FIG. 2, which depicts the resulting pressures P1 and P2 exerted on both sides of line 301 by the capillary forces. If the differences of the capillary forces acting on the resist feature exceed the elastic restoring forces of the polymers present in the resist, pattern collapse occurs. The unbalanced capillary pressure ΔP can be expressed with the following relationship:

$$\Delta P = \left(\frac{2\gamma\cos\theta 1}{S1}\right) - \left(\frac{2\gamma\cos\theta 2}{S2}\right)$$

where, γ is the surface tension of the rinse liquid, θ1 and θ2 are the contact angles of the rinse liquid on the resist surfaces, and S1 and S2 represent the spacings of the resist pattern. The inventors have concluded from the above formula that pattern collapse phenomena are worst for high aspect ratio and asymmetric structures. The inventors have further concluded that one way to reduce the unbalanced capillary force is to reduce the surface tension of the rinse liquid.

The method of the present invention therefore enables one to drastically reduce the unbalanced capillary force responsible for pattern collapses. This is achieved by creating a new process for developing a photoresist pattern. In reaching this goal, the method of the present invention takes into account not only the design rules of the mask but also the physical and chemical characteristics of the resist used in the photolithographic process. In other words, the present invention is applicable to developing photoresist patterns on a variety of electronic component substrates such as printed circuit boards, integrated circuits, microelectromechanical devices and magnetic disc components and is particularly applicable to developing photoresist patterns with high aspect ratio (greater than 2.5).

Certain embodiments of the method of the present invention also enable one to dilute and mix chemicals in an inline static mixer to produce a diluted working solution that is directly fed, for example, to a wafer track. In particular, the method, according to these embodiments, avoids the diluted chemical solution being mixed at a remote site and being transported to the place where the substrates are processed. Therefore, these methods avoid labor, transportation and delivery costs. In addition, these methods allow the user to vary the concentration on site according to specific needs.

In addition, the method of the present invention significantly reduces the presence of onsite hazards and the decomposition of the chemical solution. Indeed, onsite storage of large amounts of diluted chemical solutions may present problems of unnecessary hazards, require sizable storage space, and present a problem with fumes. Further, working solutions of diluted chemicals are unstable and subject to decomposition with time. Generally, oxidation and other modes of decomposition begin immediately following the mixing of diluted chemicals. In addition, working solutions are at their full strength and potency when used a short time after being mixed. The efficacy of the chemical components of the working solutions are greatly reduced with time following the mixing of the solutions.

In one embodiment of the invention, the method for developing a photoresist pattern consists of mixing a chemical solution of developer with a surfactant in order to obtain a diluted chemical solution of a predetermined concentration. The predetermined concentration may be set for instance by experimentation or computer simulation and is optimized to reduce defectivity and/or pattern collapses during photoresist development. The diluted chemical solution is then applied to the substrate to develop the photoresist. Analysis of the patterns is then carried out to detect any defects such as pattern collapse on the substrate. In the event that defects are detected, the predetermined concentration of surfactant is adjusted to reduce the phenomenon.

In another embodiment of the invention, the method for developing a photoresist pattern consists of optimizing the rinse step by mixing a concentrated chemical solution of surfactant with a rinsing solvent like de-ionized water. The surfactant added to the rinsing solvent enables one to reduce the capillary forces exerted on the photoresist. Similarly, the mixing concentration of the surfactant in the solvent may be fixed by computer simulation. Naturally, this concentration is optimized to reduce and/or eliminate pattern collapses and defectivity during the rinsing step. Likewise, the diluted rinse solution is then applied to the substrate to remove the developer. Analysis of the pattern is then carried out to detect defects on the substrate. In the event that pattern collapse or other defects are detected, the predetermined concentration of surfactant can then be modified.

In another embodiment of the invention, the present invention provides a method wherein the steps of mixing the concentrated chemical solution with the solvent, applying the diluted chemical solution onto the photoresist pattern and adjusting the predetermined concentration based on the analysis of the photoresist pattern are carried out in a wafer track.

Figure 3:
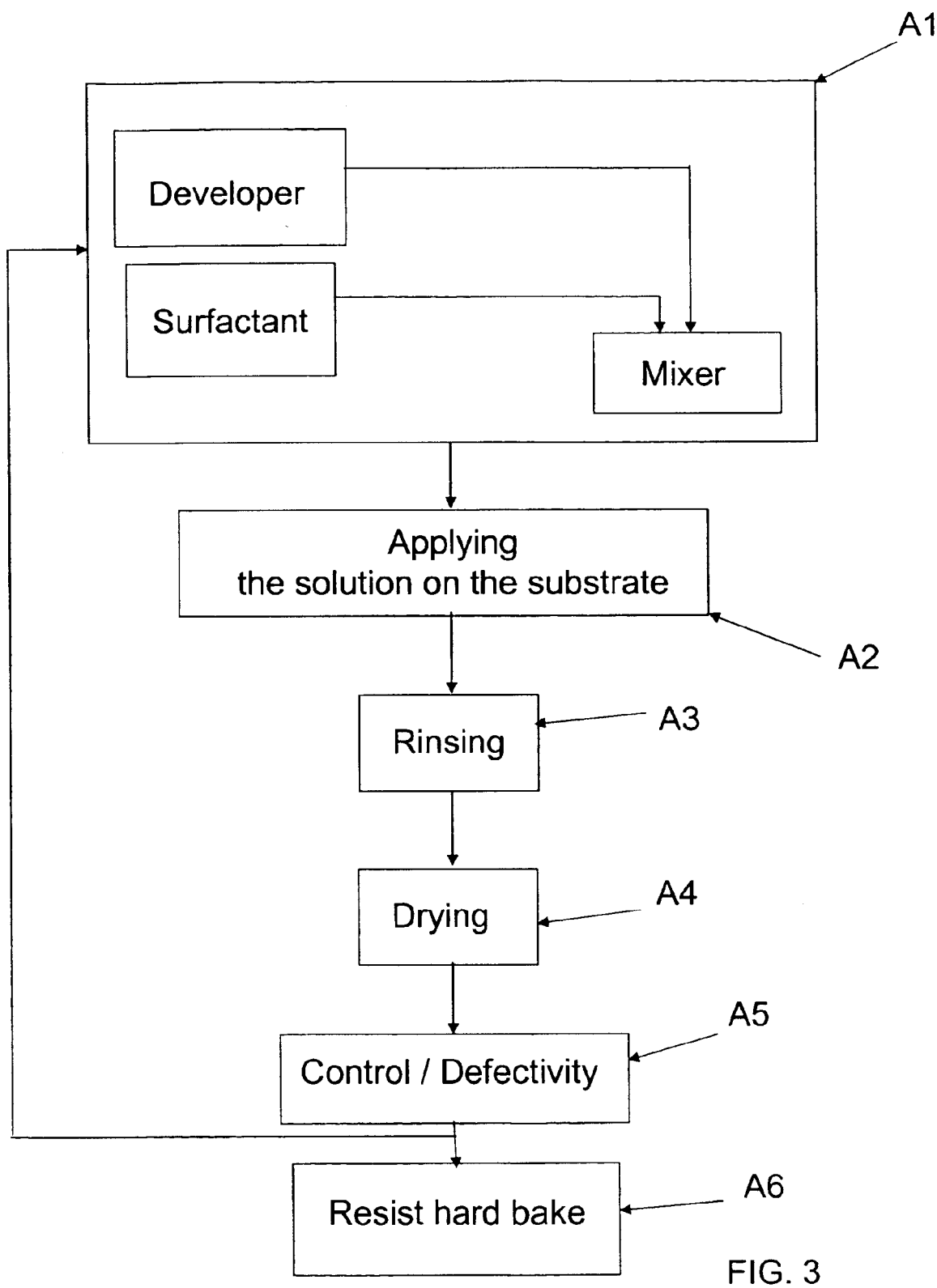
FIG. 3 is a schematic representation of the steps used in a photoresist process according to one embodiment of the invention.

Referring to FIG. 3, an exemplary embodiment of a method for developing a photoresist pattern will now be explained.

The method begins in A1 where a diluted solution of developer and surfactant of a predetermined concentration is prepared by mixing a concentrated surfactant solution with a solvent such as developer. This operation should preferably be performed in the fabrication facility where the substrates are processed in order to avoid transportation and labor costs. In doing so, the present invention greatly limits the storage of large amounts of diluted working solution, thereby reducing its chemical decomposition. More particularly, the mixing could occur in one embodiment of the invention in the wafer track. In such a case, a supply line for the surfactant and for the solvent will be provided in the track, and the mixing could be performed inside a mixing nozzle. One possible candidate for a mixing nozzle will be described later in FIGS. 5 and 6. In doing so, this aspect of embodiments of the present invention allows the wafer track to dispense different concentrations of surfactant based on the users needs.

Alternatively, the mixing could be done with a conventional mixing apparatus in a location proximate to the wafer track or the lithographic apparatus. In this embodiment, mixing may be carried out in a mixing tank, the content of which could be stored either in a storage tank or supplied to the wafer track. In this alternative embodiment, the amount of diluted working solution should correspond to an amount sufficient only to process a few substrates. In that case, the content of the mixing tank or the storage tank can be used rapidly and chemical decomposition of the diluted solution is limited.

As mentioned previously, the concentration of the diluted solution may be set by experimentation or computer simulation where the layout of the pattern to be printed on the substrates and the physical and chemical characteristics of the photoresist are entered as parameters. Commercially available photolithographic simulators such as Prolith™ or Solid-C™ may be used to evaluate the appropriate concentration of the surfactant. Naturally, relevant process data like the development time, the rinse time or the working temperature should also be entered as inputs at this stage. After determining the appropriate concentration, the data can then be loaded in the hardware of the wafer track or the lithographic apparatus along with the process parameters that are necessary to automate the overall lithographic process (i.e. soft bake temperature, spin coating speed, . . . ).

It should be understood that there is no particular restriction on the type of concentrated surfactant used in the present invention. Naturally, the choice of the surfactant will be dictated by the nature of the photoresist. Possible candidates for surfactants are anionic surfactant, anionic phosphate surfactant, n-dodecanol pentaethoxylate, nonyphenol octadecaethoxylate, or diol-type Gemini surfactants.

Anionic surfactants are characterized by having a large non-polar hydrocarbon end that is oil soluble and a polar end that is water-soluble. Anionic phosphate surfactants may also be useful in the present invention. These are surface active materials in which the anionic solubilizing group connecting hydrophobic moieties is an oxy acid of phosphorus. Gemini type surfactants are often used where dynamic wetting and low foam are critical performance metrics for the rapid wetting of surfaces.

In the present invention, the developer and the concentrated solution of surfactant are directly supplied to the mixer. For example, a concentrated form of surfactant could be transported to the mixer. In such a case, the concentrated surfactant could be stored in a relatively small container in the vicinity of the lithographic apparatus or the wafer track or alternatively in a remote cabinet. The diluted working solution could then be dispensed on the substrates or stored eventually in a small container.

While only one concentrated surfactant solution and one developer are mixed in the foregoing description, it should be apparent to one of ordinary skill in the art that additional chemicals could also be added to the working solution in step A1. That is, in one embodiment of the invention a second concentrated chemical solution may be provided to the mixer. This second concentrated chemical solution could contain for example a second type of surfactant or concentrated developer, which could also be mixed to the working solution. For example, a concentrated form of TMAH of around 25% to 40% could be transported to the mixer to be mixed with a solvent such as de-ionized water.

The method then proceeds to A2 where the diluted working solution is dispensed on the photoresist. At this stage, various methods could be used to apply the diluted developer solution to the substrates. In one embodiment of the invention, the substrates, disposed in a chemically resistant carrier, may be immersed in a tank where the diluted working solution has been stored after mixing. In this embodiment, an entire batch of substrates could be treated at once.

In another embodiment, a spray development may be applied. In such a case, the exposed wafer is sprayed with the developer composition for a certain period of time to develop the pattern. Spray processing can be done in either single or batch systems.

Yet, in another embodiment, a puddle development could be employed. In that case, the diluted working solution is puddled onto the photoresist while the substrate is at rest or rotating slowly and the substrate is spun or continues to spin slowly at, for example, 100 rpm to distribute the developing solution over the wafer surface.

The method then proceeds to step A3 where the substrates are rinsed to remove the developing solution. The rinse procedure may use the same techniques shown above to dispense the developer on the substrate surface. That is, the rinse step may be achieved either by immersion in a rinse composition bath, by spraying or by puddling. After rinsing, the substrates may be dried (A4) using conventional techniques such as air drying or spin drying.

Next, the method proceeds to step A5 where the photoresist pattern is inspected to quantify key aspects of the pattern such as the dimensions of the pattern, determine whether pattern collapse occurred, and determine if other defects occurred during the process. At this stage, conventional methods of inspection may be used. In one embodiment of the invention, inspection of aggressive patterns of photoresist may be carried out with a scanning electron microscopy. In another embodiment of the invention, detection may be done with a defectivity monitoring tool, which will provide a mapping of density of defects on the substrates. Other metrology tools such as an ellipsometer or scatterometry may also be used.

In the event that defects related to pattern collapse are detected or the feature size is out of control limits, the concentration can be adjusted to eradicate those defects or change the feature size. In such a case, the substrates may be reworked. Information obtained during the inspection step will be loaded in the hardware of the wafer track, the lithographic apparatus or possibly in the defectivity monitoring tool. The data collected will serve as a database, which will be used to correlate the concentration of the diluted working solution with the rate of defects, type of defects appearing on the substrates, and feature sizes. Adjustment may then be done by comparison with results collected on substrates that were previously processed with a different surfactant concentration.

Alternatively, if the predetermined concentration of the diluted working solution is adequate, ie., if no defect appears at the inspection step, the method proceeds to A6 where a Resist Hard Bake is frequently performed. Alternatively, the Resist Hard Bake step can also be performed prior to inspection step A5.

Figure 4:
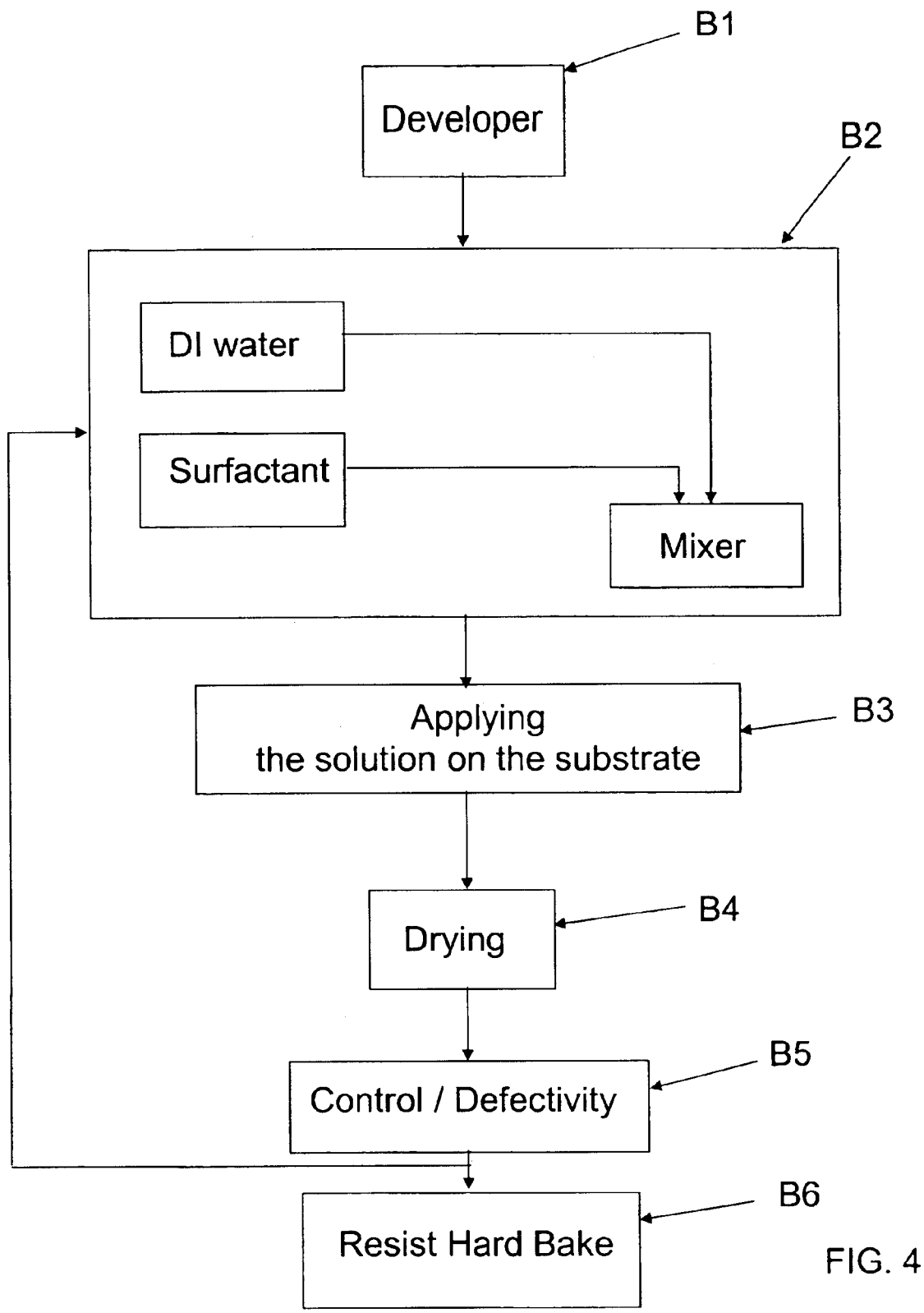
FIG. 4 is a schematic representation of the steps used in a photoresist process according to one embodiment of the invention.

Referring to FIG. 4, a method for developing a photoresist pattern according to another embodiment of the invention will now be explained.

The method begins in B1 where a developer solution is applied to the photoresist. The developing solution may be either a pre-diluted solution provided by a supplier or preferably a diluted working solution prepared onsite according to the method represented in FIG. 3.

The method then proceeds to step B2 where a rinse solvent is prepared by mixing a concentrated solution of surfactant with a solvent. As mentioned previously, the addition of surfactant greatly limits the capillary forces responsible for pattern collapses. The solvent that may be used in one embodiment of the invention is de-ionized water. Possible candidates for surfactants are, in addition to those previously listed, anionic surfactant, anionic phosphate surfactant, or diol-type Gemini surfactant. Anionic surfactants are characterized by having a large non-polar hydrocarbon end that is oil soluble and a polar end that is water-soluble. Anionic phosphate surfactants may also be useful in the present invention. These are surface active materials in which the anionic solubilizing group connecting hydrophobic moieties is an oxy acid of phosphorus. Gemini type surfactants are often used where dynamic wetting and low foam are critical performance metrics for the rapid wetting of surfaces.

Similar to the method illustrated in FIG. 3, the predetermined concentration of surfactant added to the solvent may be optimized by experimentation or computer simulations. Experiments have shown that an appropriate concentration of surfactant in the rinse solvent can be comprised between 10 ppm and 300 ppm; however this range will be different for different resist processes. The layout of the pattern to be printed on the substrates and the physical and chemical characteristics of the photoresist are entered as parameters for the simulation along with other relevant process data. After determining the appropriate concentration of surfactant in the rinse solution, the data can then be loaded in the hardware of the wafer track or the lithographic apparatus. The method therefore enables one to strictly adjust, keep and control the content of the surfactant at a definite value. In addition, the method of the present invention enables one to practice the procedure quickly and labor-savingly.

The method then proceeds to B3 where the rinse solution is applied to the surface substrates. Again, various techniques may be suitable to remove the developer and are identical to those previously described. Specifically, the rinse step may be done by immersion, spraying or puddling. After rinsing, the substrates are subsequently dried (B4) by air drying or spin drying.

Next, the method proceeds to step B5 where the photoresist patterns are inspected. At this stage, conventional methods of inspection may be used. In one embodiment of the invention, inspection of aggressive patterns of photoresist may be carried out with a scanning electron microscopy. Alternatively, detection of defects and pattern collapse may be carried out in another embodiment of the invention with a defectivity monitoring tool. Commercially available tools like KLA-TENCOR™ eS30 may be suitable to perform this monitoring.

In the event that defects and/or pattern collapse is detected, the surfactant concentration in the rinse solvent can be adjusted. Data collected during the inspection will be loaded in the hardware of the wafer track, the lithographic apparatus or possibly in the defectivity monitoring tool. This information will then serve as a database that will enable the process engineer to correlate the density of defects and types of defects appearing on the substrate with the concentration of surfactant. Adjustment of the mixture may be done afterwards by comparison with results collected on substrates that where previously processed with a different concentration of surfactant.

Alternatively, if the predetermined concentration provides satisfactory results, i.e., if no defect appears at the inspection step, the method proceeds to B6 where a Resist Hard Bake is performed. Alternatively, the Resist Hard Bake B6 can be performed prior to inspection step B5.

As mentioned previously, dilution of the concentrated surfactant solution with a developer or mixing of the surfactant with the rinsing solvent may be performed onsite in an inline static mixer to produce a working solution that is directly fed, for example, to a wafer track. Therefore, the method of the present invention avoids the diluted chemical solution being mixed at a remote site and being transported to the place where the substrates are processed, thereby avoiding labor, transportation and delivery costs. This method also allows for the optimization of the mixed solution on site and the use of different mixtures for different processes without additional logistics issues.

In one embodiment of the invention, dilution of the developer, mixing the surfactant with developer, or mixing surfactant with the solvent could be performed in a mixing bath whose content could later be discharged on the substrates. In such a case, storage of the working solution could be done in a cabinet located in the vicinity of the wafer track. In another embodiment of the invention, the diluted working solution could be generated inside a mixing nozzle and directly fed to the substrate in order to avoid chemical decomposition of the solution.

Figure 5:
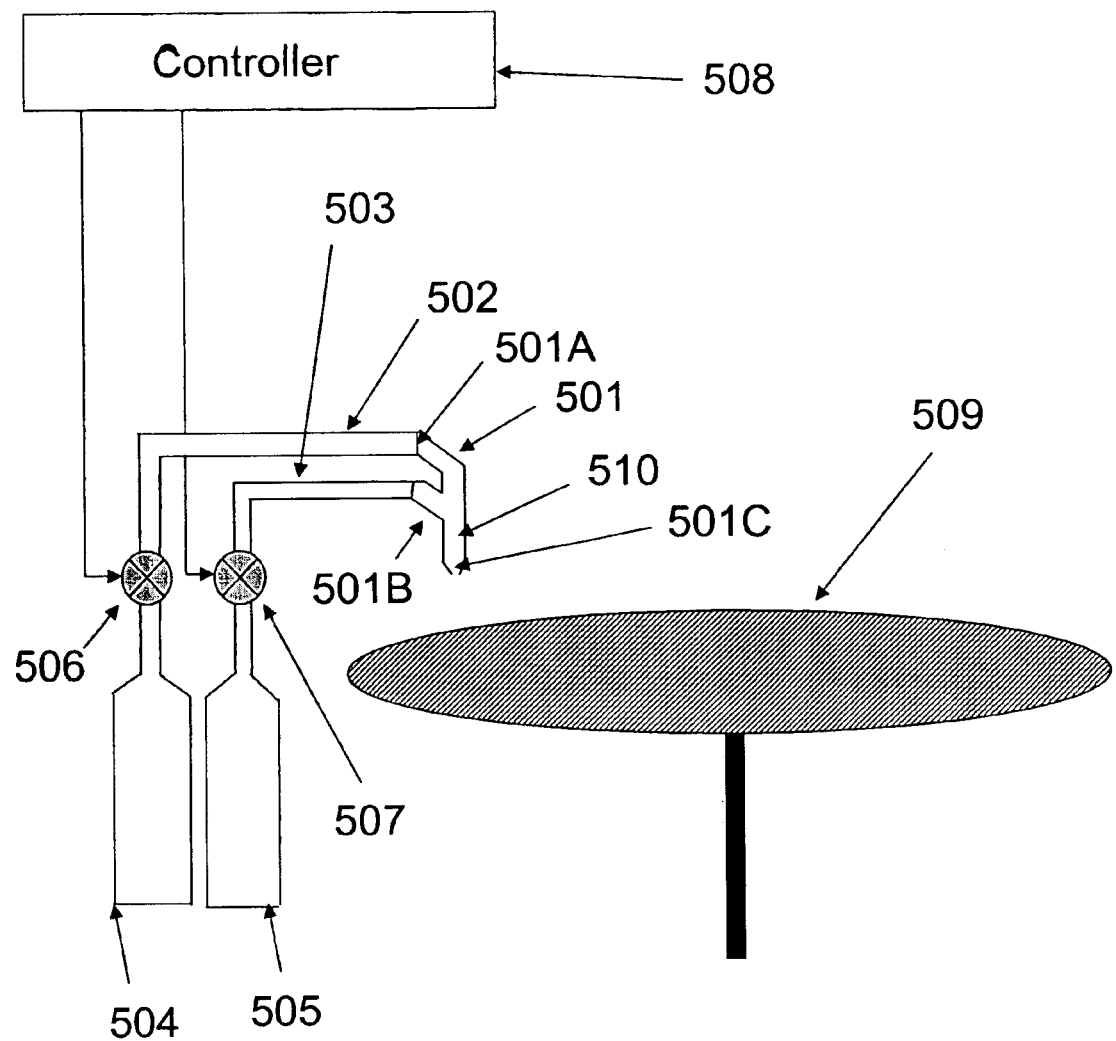
FIG. 5 represents one embodiment of an apparatus carrying out the object of the invention.

FIG. 5 is a schematic representation of an embodiment of the invention where the working solution is created inside a mixing nozzle.

In this embodiment, the mixing nozzle 501 comprises a nozzle body 510 on which inlets 501A and 501B and outlet 501C are arranged. Inlet 501A communicates with container 504 in which a concentrated solution of developer or a solution containing a surfactant is disposed. Likewise, inlet 501B communicates with the container 505 in which a solvent is disposed.

In this embodiment, the concentrated solution and the solvent are supplied to inlets 501A and 501B with channels 502 and 503. Each of the supplying channels of concentrated developer and solvent is equipped with valves and/or precision pumps 506 and 507, which control the volume and flow rate of fluid sent to the mixing nozzle 501.

In operation, controller 508 regulates the valves and/or precision pumps 506 and 507, thereby controlling the amount of developer and solvent entering inlets 501A and 501B. Dilution of the concentrated solution of developer is done mechanically inside the hollow mixing body 510 and the solution is dispensed to wafers 509 by outlet 501C.

Figure 6:
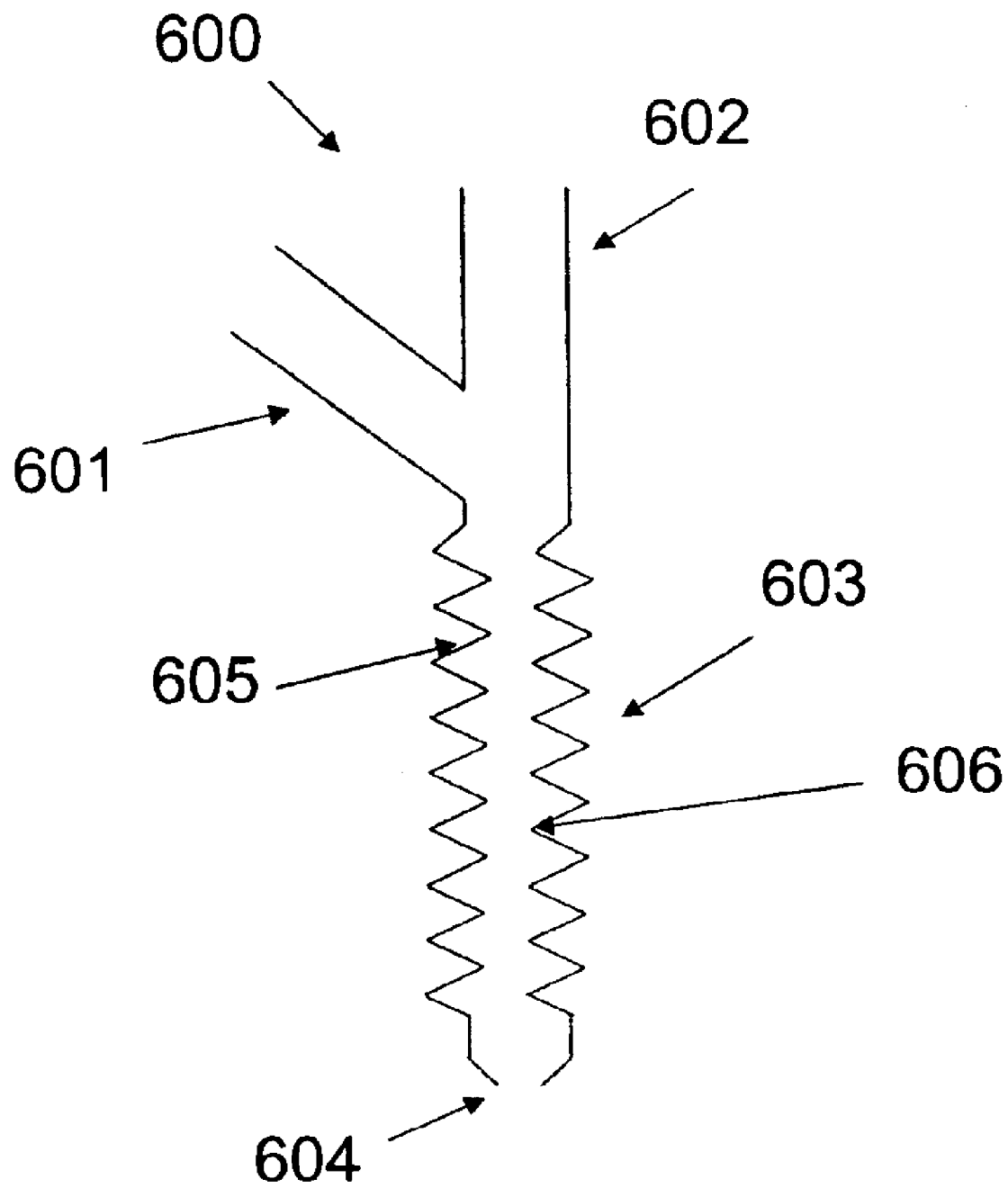
FIG. 6 represents one embodiment of a mixing nozzle, which is used to carry out the object of the invention.

FIG. 6 is a schematic representation of a mixing nozzle according to one embodiment of the present invention.

In this embodiment, mixing nozzle 600 is conveniently designed to dilute a concentrated chemical solution with a solvent. Specifically, mixing nozzle 600 comprises an elongated body 603 on which inlets 601 and 602 and outlet 604 are arranged. The flow of solution entering inlets 601 and 602 may be regulated with a valve system and/or precision pumps, as illustrated in FIG. 5.

In the embodiment represented in FIG. 6, elongated body 603 has a substantial cylindrical shape and could be rigid or elastic. However, it should be apparent to one skilled in the art to which the invention pertains that alternative shapes may also be used to carry out the object of the invention. Mixing nozzle 600 may be made from any material chemically compatible with the solutions supplied to inlets 601 and 602. Hence, mixing nozzle 600 may be fabricated from such materials as glass, quartz, Teflon, polypropylene, or the like.

Elongated body 603 also comprises a mixing flow surface 605 having an undulating shape. Mixing flow surface 605 may cover the entire elongated body 603 and is constructed and arranged to maximize the interaction between the constitutive elements of the concentrated solution and the solvent.

Due to the action of the mixing flow surface 605, the fluid flowing inside elongated body 603 is in a non-laminar regime. Depending on the physical characteristics of the supplied solutions and the flowing conditions, a turbulence regime can be established inside elongated body 603. Under such a regime, vortex will appear at the summits 606 of mixing flow surface 605. Exchange between the fluids are no longer controlled by a diffusion process. It follows that interaction between the elements of the concentrated solution and the solvent is enhanced. As a result, the dilution process is maximized.

While a detailed description of presently preferred embodiments of the invention have been given above, various alternatives, modifications, and equivalents will be apparent to those skilled in the art without varying from the spirit of the invention. For example, it should be apparent to one of ordinary skill in the art that the mixing nozzle may have a different geometry and that additional chemical solutions could be fed to the mixing nozzle along with those depicted in FIG. 5. Therefore, the above description should not be taken as limiting the scope of the invention, which is defined by the appended claims.

What is claimed is:

1. A method for developing a photoresist pattern on a substrate comprising:
   mixing, in a fabrication facility where the substrate is processed, a concentrated chemical solution with a solvent to obtain a diluted chemical solution of developer of a predetermined concentration;
   applying the diluted chemical solution of developer onto the photoresist pattern;
   analyzing the photoresist pattern after the applying to detect pattern collapses; and
   adjusting the predetermined concentration based on the analysis of the pattern collapses.

2. The method of claim 1, wherein the mixing, applying and adjusting are performed in a wafer track.

3. The method of claim 1, wherein the concentrated chemical solution comprises a surfactant.

4. The method of claim 1, wherein the solvent is de-ionized water.

5. The method of claim 1, wherein the solvent is developer.

6. The method of claim 1, wherein the diluted chemical solution has a concentration within a range from 10 ppm to 300 ppm.

7. The method of claim 1, wherein the analyzing is performed with one of a defectivity monitoring tool, a Scanning Electron Microscope and a scatterometry tool.

8. The method of claim 1, wherein the predetermined concentration of the diluted chemical solution of developer depends on the physical and chemical characteristics of the photoresist and on the pattern to be printed on the substrate.

9. The method of claim 1, wherein the predetermined concentration of the diluted chemical solution is determined by computer simulation.

10. The method of claim 1, wherein the mixing is performed in a nozzle, the mixing comprising:
    flowing the concentrated chemical solution in the nozzle in a non-laminar regime; and
    flowing the solvent in the nozzle in a non-laminar regime.

11. The method of claim 10, wherein the nozzle comprises a nozzle body having an undulating surface.

12. The method of claim 10, wherein the applying comprises discharging the volume defined by the nozzle on the substrate.

13. The method of claim 1, wherein the mixing is performed in a mixing tank.

14. The method of claim 1, wherein the concentrated chemical solution is a solution selected from the group consisting of sodium hydroxide, potassium hydroxide and tetramethylammonium hydroxide.

15. An apparatus for developing a photoresist pattern on a substrate comprising:
    a supply line of concentrated chemical solution;
    a supply line of solvent; and
    a nozzle, said nozzle comprising a nozzle body on which a first inlet, a second body and an outlet are arranged;
    wherein:
    the supply line of concentrated chemical solution is in communication with the first inlet; and
    the supply line of solvent is in communication with the second inlet.

16. The apparatus of claim 15, wherein the nozzle body comprises a mixing flow surface.

17. The apparatus of claim 15, wherein the concentrated chemical solution and the solvent are flowed in the nozzle body in a non-laminar regime.

18. A method for optimizing a post develop rinse on a substrate comprising:
    mixing, in a fabrication facility where the substrate is processed, a concentrated chemical solution with a solvent to obtain a post develop rinse solution of a predetermined concentration;
    developing a latent image on the substrate to form a developed photoresist pattern;
    applying the post develop rinse solution onto the developed photoresist pattern;
    analyzing the developed photoresist pattern after the applying; and
    adjusting the predetermined concentration based on analysis of the developed photoresist pattern.

19. The method of claim 18, wherein the mixing, developing, applying and adjusting are performed in a wafer track.

20. The method of claim 18, wherein the concentrated chemical solution comprises a surfactant.

21. The method of claim 18, wherein the solvent is de-ionized water.

* * * * *